(12) United States Patent
He (10) Patent No.: US 11,470,713 B2
(45) Date of Patent: Oct. 11, 2022

(54) CIRCUIT BOARD WITH HEAT DISSIPATION STRUCTURE AND METHOD FOR MANUFACTURING SAME

(71) Applicants: Avary Holding (Shenzhen) Co., Limited., Shenzhen (CN); QING DING PRECISION ELECTRONICS (HUAIAN) CO.,LTD, Huai an (CN)

(72) Inventor: Si-Hong He, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 99 days.

(21) Appl. No.: 17/032,396

(22) Filed: Sep. 25, 2020

(65) Prior Publication Data

US 2022/0095447 A1 Mar. 24, 2022

(30) Foreign Application Priority Data

Sep. 21, 2020 (CN) .......................... 202010997281.8

(51) Int. Cl.
*H05K 1/02* (2006.01)
*F28D 15/02* (2006.01)

(52) U.S. Cl.
CPC ........... *H05K 1/0203* (2013.01); *F28D 15/02* (2013.01); *H05K 1/0204* (2013.01); *H05K 2201/064* (2013.01); *H05K 2201/09036* (2013.01)

(58) Field of Classification Search
CPC .. H05K 1/0201; H05K 1/0203; H05K 1/0204; H05K 1/0212; H05K 1/0272; H05K 2201/064; H05K 2201/09036; H05K 2201/10416; H05K 2201/1056; F28D 15/02; F28D 2015/0225; F28D 15/0275; F28D 15/0283; F28D 20/02; F28D 20/021; F28D 20/023; F28D 20/025
See application file for complete search history.

(56) References Cited

U.S. PATENT DOCUMENTS

| | | | | |
|---|---|---|---|---|
| 2007/0045801 | A1* | 3/2007 | Sugiyama | H05K 1/09 257/684 |
| 2016/0146545 | A1* | 5/2016 | Engelhardt | F28D 15/046 165/76 |
| 2017/0099725 | A1* | 4/2017 | Maillet, Jr. | G01R 33/3614 |

FOREIGN PATENT DOCUMENTS

| | | |
|---|---|---|
| CN | 101686611 A | 3/2010 |
| CN | 105873369 A | 8/2016 |
| CN | 106658938 A | 5/2017 |

(Continued)

*Primary Examiner* — Timothy J Thompson
*Assistant Examiner* — John B Freal
(74) *Attorney, Agent, or Firm* — ScienBiziP, P.C.

(57) ABSTRACT

A circuit board with inbuilt heat dissipating structure includes a stacked structure and the heat dissipation structure. The stacked structure includes first and second copper layers and a cover plate. The embedded heat dissipation structure includes a base body, a thermally conductive adhesive, and a phase changing liquid. The base body penetrates the first copper layer and the first substrate layer, is connected to the second copper layer, and defines grooves. The grooves contain the phase changing liquid. The thermally conductive adhesive seals the ends of the grooves and the cover plate is located on a surface of the stacked structure and covers the thermally conductive adhesive. A method for manufacturing the circuit board is further disclosed.

12 Claims, 9 Drawing Sheets

(56) References Cited

FOREIGN PATENT DOCUMENTS

CN 109348616 A 2/2019
TW 200845874 A 11/2008

\* cited by examiner

CIRCUIT BOARD WITH HEAT DISSIPATION STRUCTURE AND METHOD FOR MANUFACTURING SAME

FIELD

The subject matter herein generally relates to circuit boards, especially to a circuit board with a heat dissipation structure and a method for manufacturing the same.

BACKGROUND

With the development of electronic devices, more and more electronic components are being integrated into an electronic device. The electronic components are supported on a circuit board and efficient heat dissipation from the circuit board becomes more important.

BRIEF DESCRIPTION OF THE DRAWINGS

Implementations of the present technology will now be described, by way of embodiment, with reference to the attached figures.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale, and the proportions of certain parts may be exaggerated to better illustrate details and features of the present disclosure.

The term "comprising," when utilized, means "including, but not necessarily limited to"; it specifically indicates open-ended inclusion or membership in the so-described combination, group, series, and the like. When a first component is referred to as "connecting" to a second component, it is intended that the first component may be directly connected to the second component or may be indirectly connected to the second component via a third component between them.

FIGS. 1 to 12 illustrate a method for manufacturing a circuit board 100 with a heat dissipation structure 30 in accordance with an embodiment. The method includes steps S1 to S6.

Figure 1:
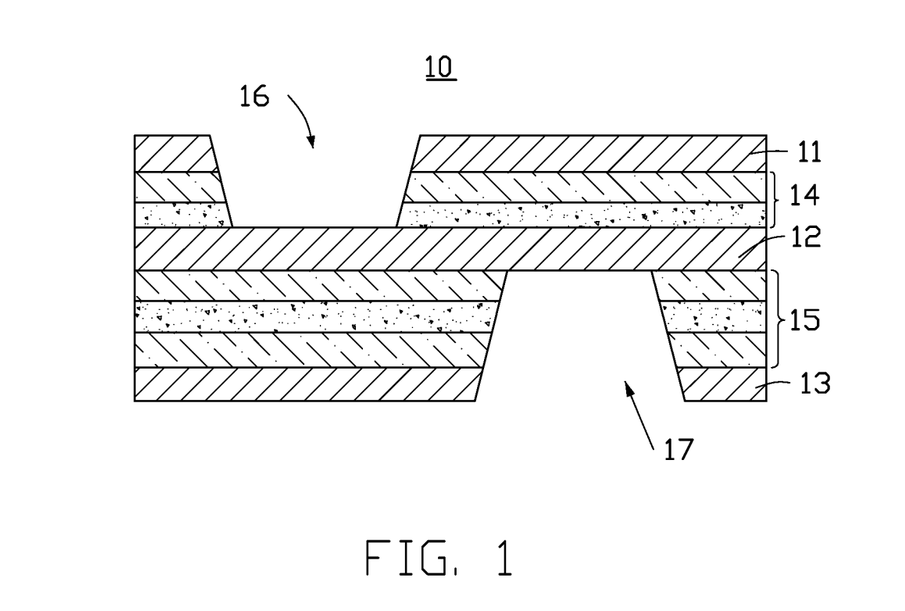
FIG. 1 is a cross-sectional view of a stacked structure with a first opening and a second opening in accordance with an embodiment.

In step S1, referring to FIG. 1, a stacked structure 10 is provided. The stacked structure 10 includes a first copper layer 11, a first substrate layer 14, and a second copper layer 12 which are stacked along a first direction. The stacked structure 10 defines a first opening 16 which penetrates the first copper layer 11 and the first substrate layer 14 along the first direction. In the embodiment, the first direction refers to a thickness direction of the circuit board 100.

The stacked structure 10 may be a copper clad laminate without circuit layers, such as a double-sided copper clad laminate, or may be a circuit board with circuit layers. The stacked structure 10 may further include other copper layers or circuit layers located between the first copper layer 11 and the second copper layer 12, the different copper layers or circuit layers being spaced by substrate layers.

The stacked structure 10 further includes a second substrate layer 15 and a third copper layer 13. The second substrate layer 15 is stacked on a surface of the second copper layer 12 away from the first substrate layer 14, the third copper layer 13 is located on a surface of the second substrate layer 15 away from the second copper layer 12.

In one embodiment, the stacked structure 10 further defines a second opening 17 which penetrates the third copper layer 13 and the second substrate layer 15. The first opening 16 and the second opening 17 are both blind holes and are recessed with respect to opposite surfaces of the stacked structure 10.

The numbers of first and second openings 16 and 17 may be set according to needs. In one embodiment, there are two or more first openings 16 and two or more second openings 17.

Both of the first opening 16 and the second opening 17 may be formed by laser drilling, mechanical drilling, or the like.

Figure 2:
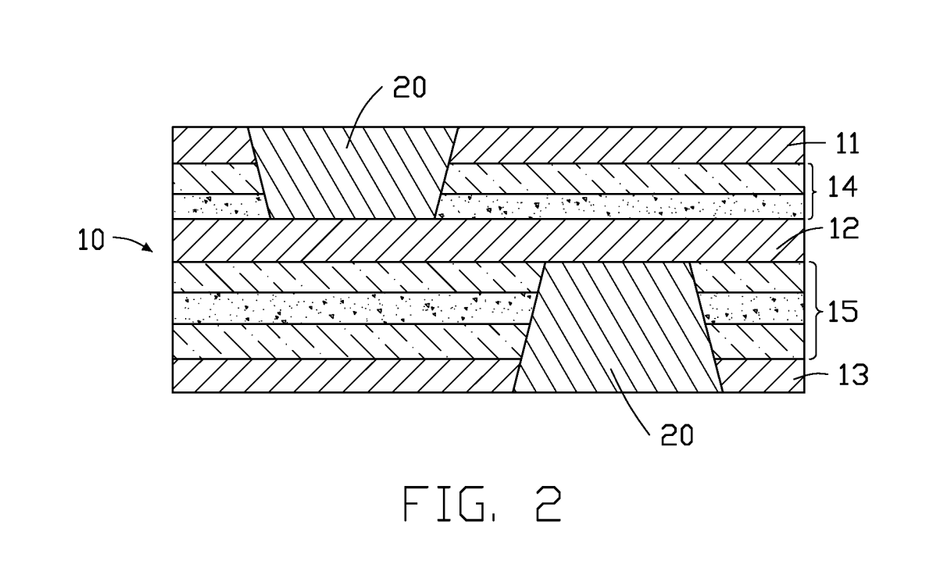
FIG. 2 is a cross-sectional view showing copper blocks formed in the first opening and the second opening of FIG. 1.

In step S2, referring to FIG. 2, a copper block 20 is formed in the first opening 16. The copper block 20 may be formed by plating.

The copper block 20 completely infills the first opening 16, and the surface of the copper block 20 which is exposed from the first opening 16 is flush with a surface of the first copper layer away from the first substrate layer 14. In the embodiment, the method further includes forming another copper block 20 to infill the second opening 17. The surface of the other copper block 20 which is exposed from the second opening 17 is flush with a surface of the third copper layer 13 away from the second substrate layer 15.

In one embodiment, when forming the copper block 20 by plating, a copper plated layer covering the first copper layer 11 and a copper plated layer covering the third copper layer 13 are also formed. Each of the two copper plated layers is connected to a copper block 20.

Figure 3:
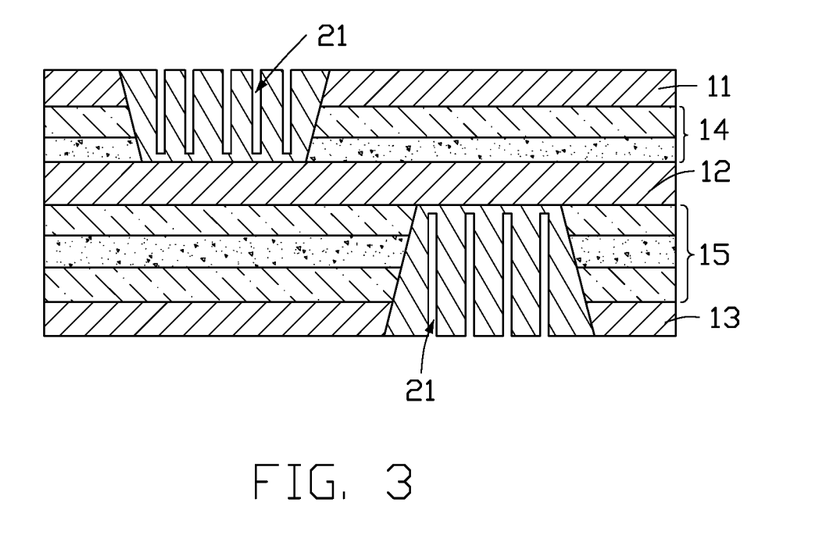
FIG. 3 is a cross-sectional view showing grooves formed on copper blocks of FIG. 2.
Figure 4:
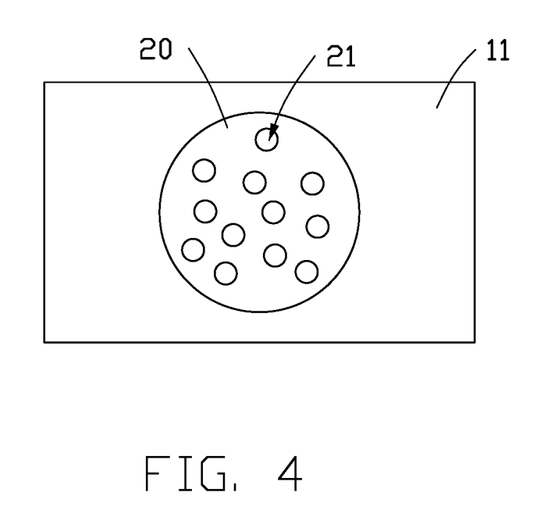
FIG. 4 is a top view of the structure shown in FIG. 3.

In step S3, referring to FIG. 3, the copper block 20 defines at least one groove 21. The exposed surface of the copper block 20 is recessed inwardly along the first direction to form the groove 21.

In one embodiment, each copper block 20 defines a plurality of grooves 21. The grooves 21 may be formed by etching. Each groove 21 is strip-shaped, and the grooves 21 are alternately arranged in a honeycomb shape (shown in FIG. 4).

In one embodiment, the exposed surface of the copper block 20 in the second opening 17 defines at least one groove 21.

In step S4, referring to FIGS. 5 to 9, a phase changing liquid 22 is injected in the groove 21, and an end of the groove 21 is sealed by a thermally conductive adhesive 23 to form a heat dissipation chamber 24. The phase changing liquid 22 is thus sealed in the heat dissipation chamber 24. In the first direction, a height H1 of the phase changing liquid 22 in the heat dissipation chamber 24 is less than a height H2 of the heat dissipation chamber 24, so that a certain amount of space exists in the heat dissipation chamber 24 for the phase changing liquid 22 to undergo a phase change.

The phase changing liquid 22 may be a composite liquid composed of a variety of substances, having the characteristics of high boiling point, low condensation point, and being non-volatile. According to different proportions of the substances, the boiling point and condensation point of the phase changing liquid 22 can be controlled artificially.

Figure 5:
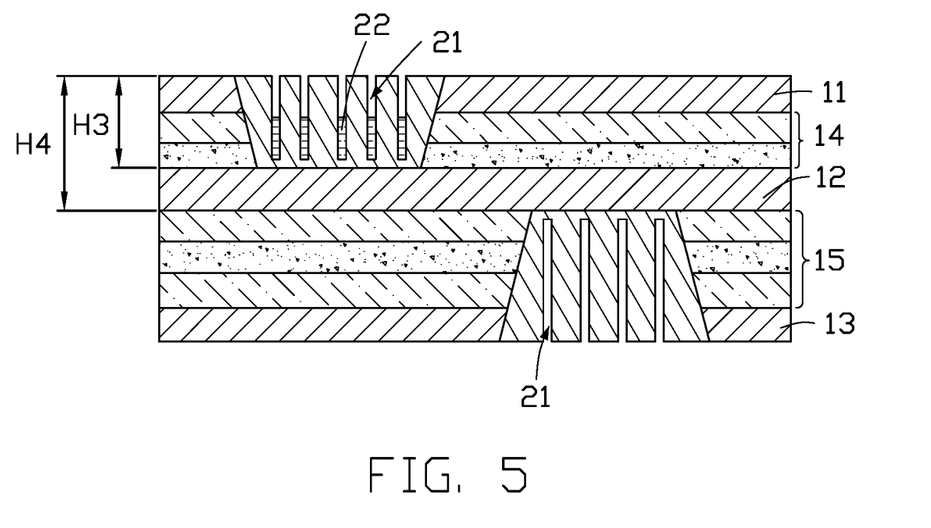
FIG. 5 is a cross-sectional view showing a phase changing liquid contained in the grooves defined on one surface of the stacked structure of FIG. 3.

Referring FIG. 5, in the first direction, a height H3 of the groove 21 is less than a sum of a thickness of the first copper block 20 and a thickness H4 of the second copper layer 12. That is, the groove 21 does not completely penetrate the second copper layer 12 in the stacked structure 10, preventing leaking of the phase changing liquid 22 from the groove 21 into the second dielectric layer 15, thereby avoiding a short circuit or poor delamination caused by the second dielectric layer 15 absorbing the phase changing liquid 22.

The thermally conductive adhesive 23 may be one of thermally conductive silicone, polyimide, polyethylene terephthalate, and polyvinyl fluoride.

The thermally conductive adhesive 23 is applied to an end of each groove 21 away from the second copper layer 12. In one embodiment, the thermal conductive adhesives 23 in the ends of the grooves 21 are spaced from each other.

Figure 7:
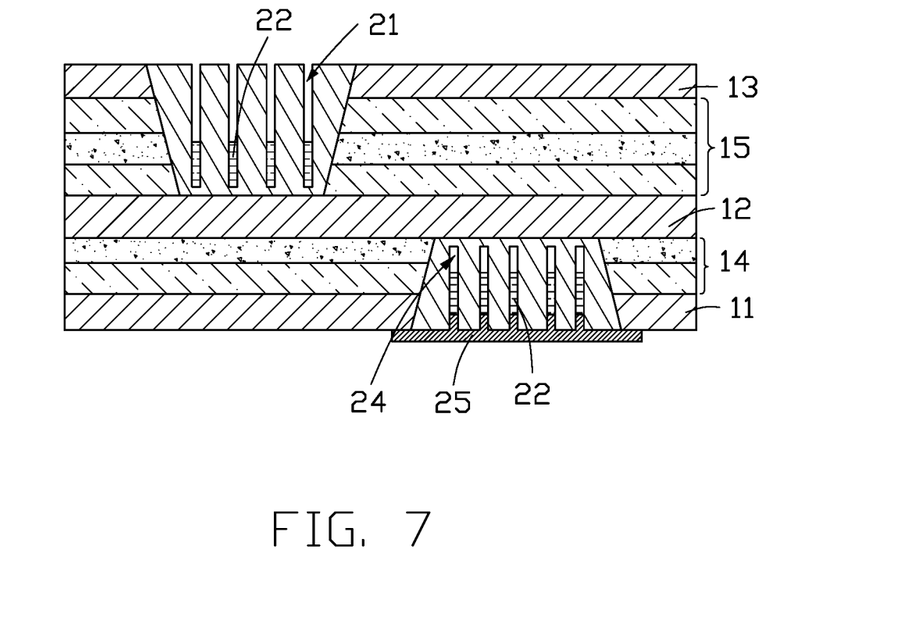
FIG. 7 is a cross-sectional view showing a phase changing liquid contained in the grooves defined on other surface of the stacked structure of FIG. 3.
Figure 8:
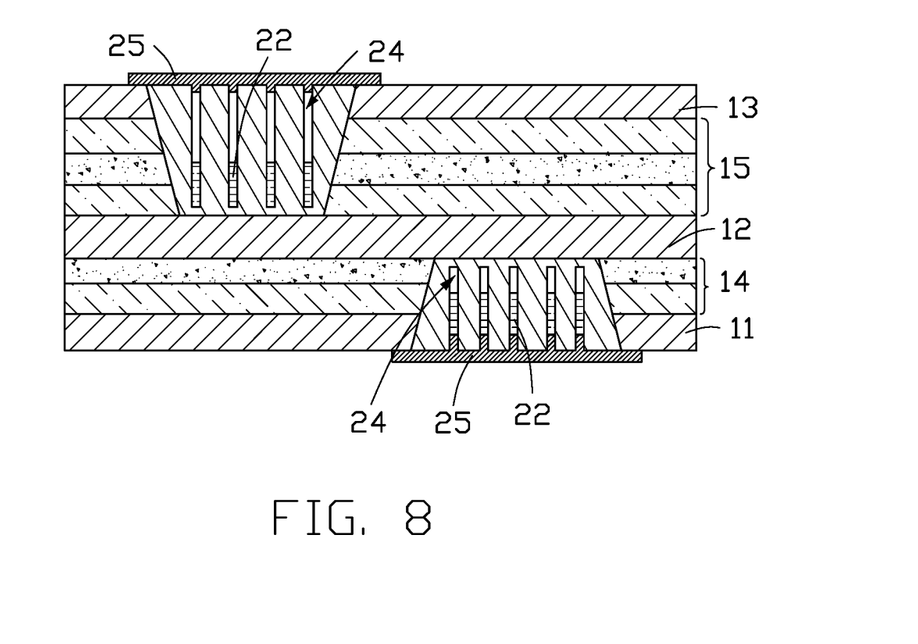
FIG. 8 is a cross-sectional view showing another adhesive layer pressed onto the grooves of FIG. 7.

Referring to FIGS. 7 and 8, the fluidity of the phase changing liquid 22 requires the grooves 21 on one side of the stacked structure 10 being filled with the phase changing liquid 22, and the thermal conductive adhesive 23 being used to seal the grooves 21. The grooves 21 on the other side of the stacked structure 10 are then filled with the phase changing liquid 22 and sealed with the thermally conductive adhesives 23.

The step of sealing the grooves 21 with the thermally conductive adhesives 23 includes steps S401 to S402.

Figure 6:
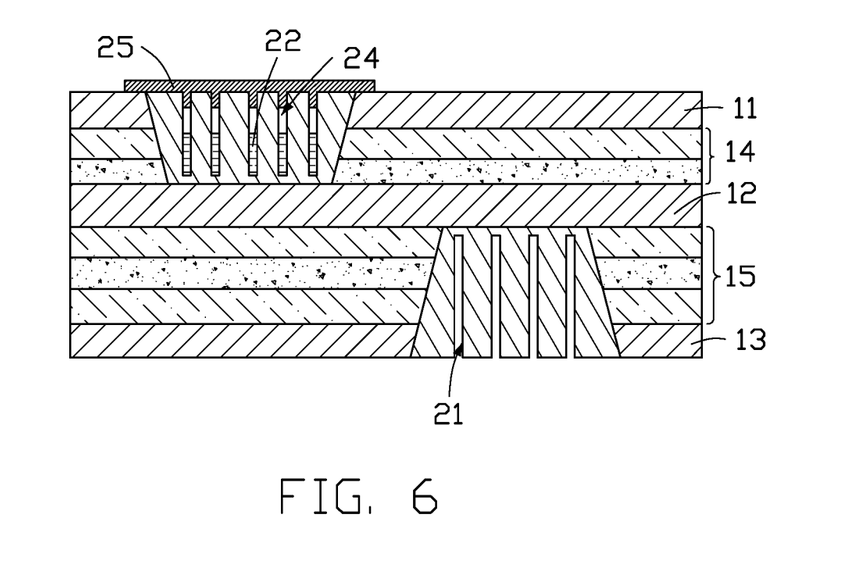
FIG. 6 is a cross-sectional view showing an adhesive layer pressed onto the grooves of FIG. 5.

In step S401, referring to FIG. 6, an adhesive layer 25 is pressed onto a surface of the first copper layer 11. The adhesive layer 25 is deformed during pressing so as to intrude into one end of each groove 21.

Figure 9:
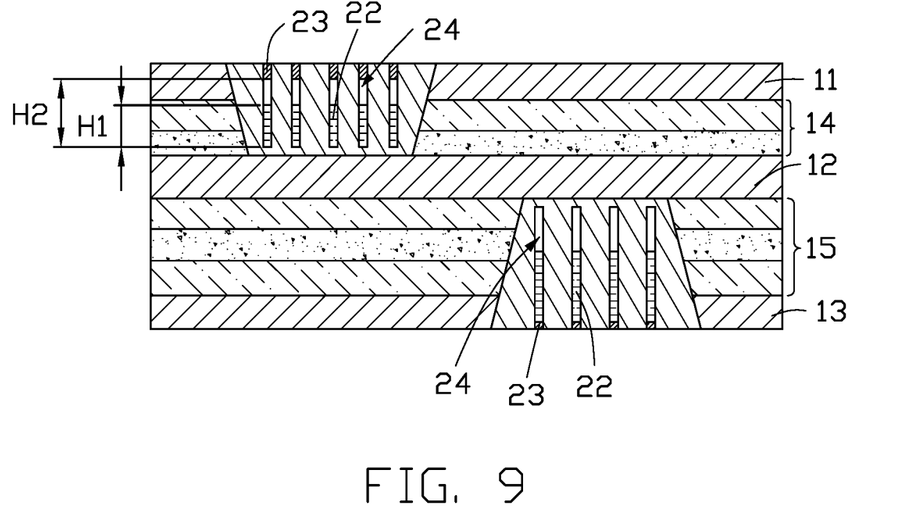
FIG. 9 is a cross-sectional view showing a part of the adhesive layer of FIG. 8 removed to form thermally conductive adhesive received in the grooves.

In step S402, referring to FIG. 9, the portion of the adhesive layer 25 which does not enter the grooves 21 is removed. The adhesive layer 25 in the groove 21 functions as the thermally conductive adhesive 23. The groove 21 is sealed by the thermally conductive adhesive 23 to form the heat dissipation chamber 24. The removal of the adhesive layer 25 which is not within the grooves 21 may be carried out by laser ablation or mechanical polishing.

Figure 10:
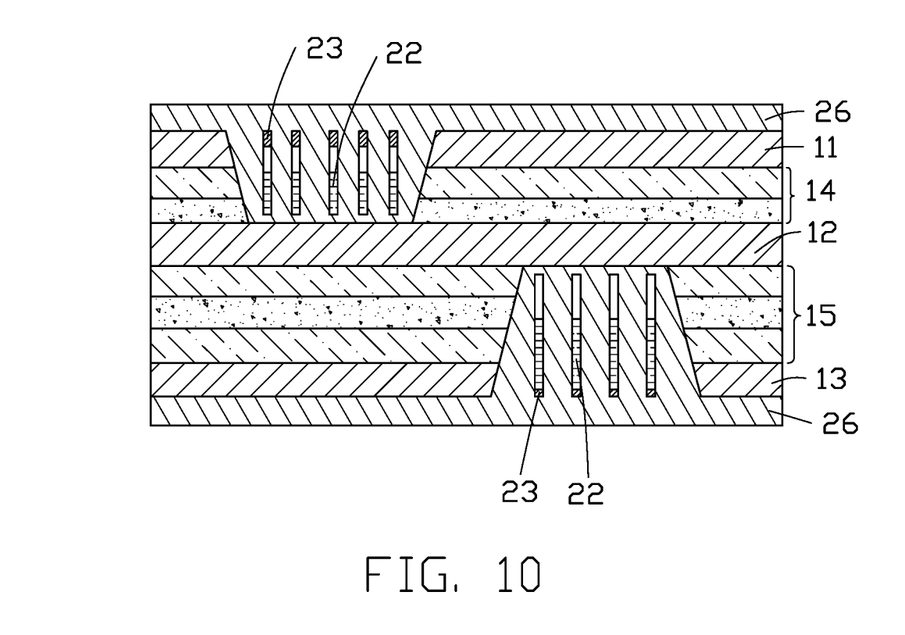
FIG. 10 is a cross-sectional view showing first copper plated layers formed on surfaces of the first copper layer and the second copper layer shown in FIG. 9.

In step S5, referring to FIG. 10, a first copper plated layer 26 is formed on a same side of the first copper layer 11 and the thermally conductive adhesive 23.

The first copper plated layer 26 is located on a surface of the first copper layer 11 away from the first substrate layer 14 and covers the thermally conductive adhesive 23. The first copper plated layer 26 may be formed by plating or laminating.

The method further includes forming another first copper plated layer 26 on a surface of the third copper layer 13 away from the second substrate layer 15. The other copper layer 26 covers the thermally conductive adhesives 23 in the grooves 21 on the third copper layer 13.

Figure 11:
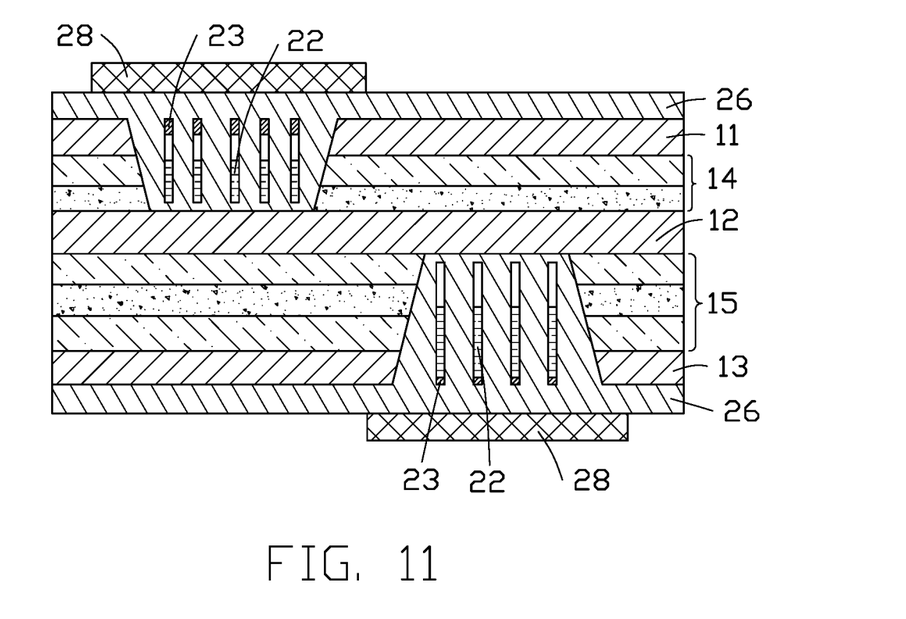
FIG. 11 is a cross-sectional view showing dry films formed on areas of the first copper plated layers corresponding to the phase changing liquid shown in FIG. 10.
Figure 12:
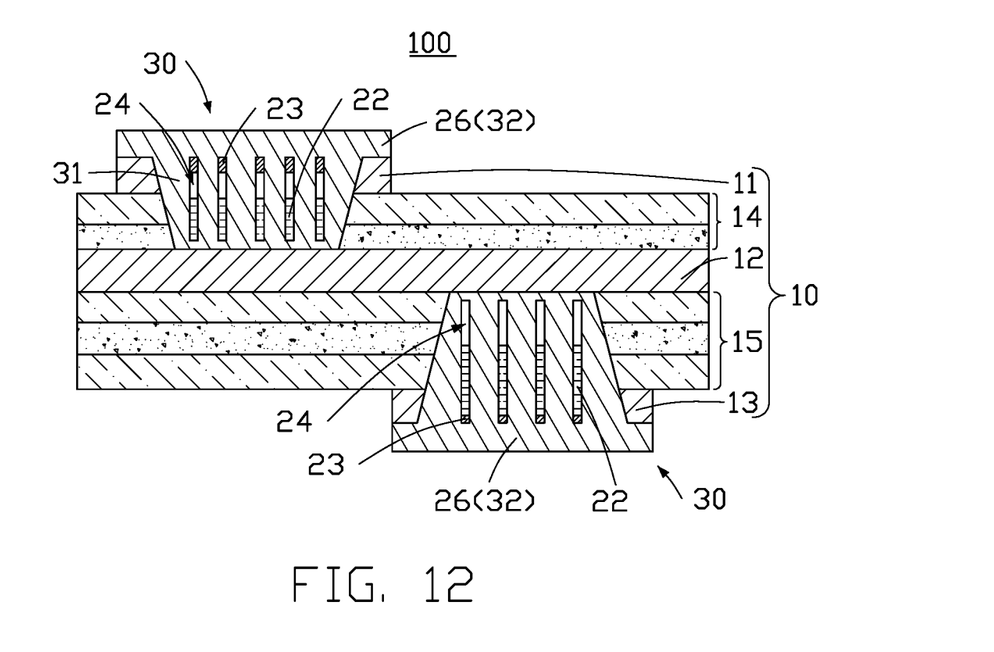
FIG. 12 is a cross-sectional view of a circuit board with a heat dissipation structure in accordance with an embodiment.

In step S6, referring to FIGS. 11 and 12, parts of the first copper plated layer 26 and the first copper layer 11 which do not correspond in position to the first opening 16 are removed, thereby obtaining the circuit board 100 with the heat dissipation structure 30.

Specifically, a dry film 28 covers a surface of the first copper plated layer 26 away from the first copper layer 11, the dry film 28 corresponding in position to the first opening 16. Parts of the first copper plated layer 26 and the first copper layer 11 which do not correspond in position to the first opening 16 are removed by a patterning process, thereby obtaining the heat dissipation structure 30. The heat dissipation structure 30 is partially embedded into the stacked structure 10. The method further includes forming another dry film 28 on a surface of the first copper layer 26 away from the third copper layer 13, and removing portions of the first copper plated layer 26 and the third copper layer 13 which do not correspond in position to the second opening 17, thereby forming another heat dissipation structure 30.

FIGS. 13 to 19 illustrate a method for manufacturing a circuit board 100a in accordance with another embodiment. In the embodiment, the first opening 16 is a through hole. The method includes steps S11 to S16.

Figure 13:
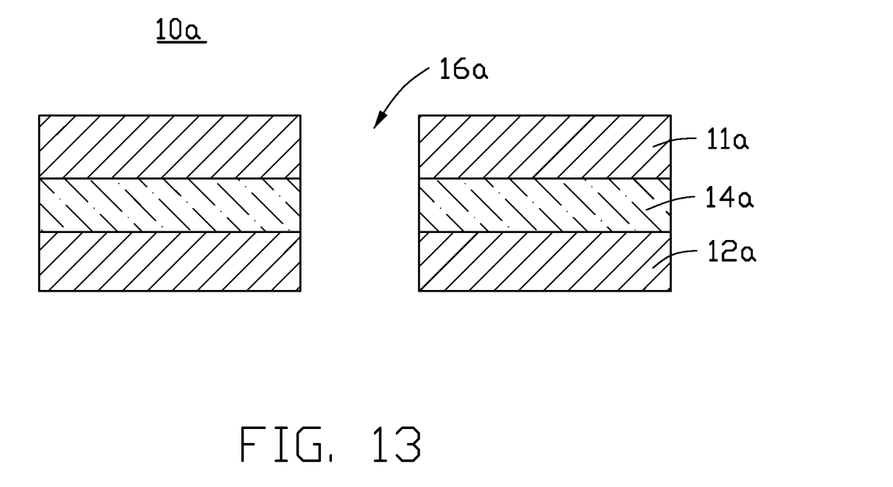
FIG. 13 is a cross-sectional view of a stacked structure with a first opening in accordance with another embodiment.

In step S11, referring to FIG. 13, a stacked structure 10a is provided. The stacked structure 10a includes a first copper layer 11a, a first substrate layer 14a, and a second copper layer 12a which are stacked along a first direction. The stacked structure 10a defines a first opening 16a which penetrates the first copper layer 11a, the first substrate layer 14a, and the second copper layer 12a along the first direction. In the embodiment, the first direction refers to a thickness direction of the circuit board 100a.

The stacked structure 10a may further include other copper layers or circuit layers located between the first copper layer 11a and the second copper layer 12a, the different copper layers or circuit layers are separated by substrate layers.

In one embodiment, the stacked structure 10a may define a through hole and a blind hole.

Figure 14:
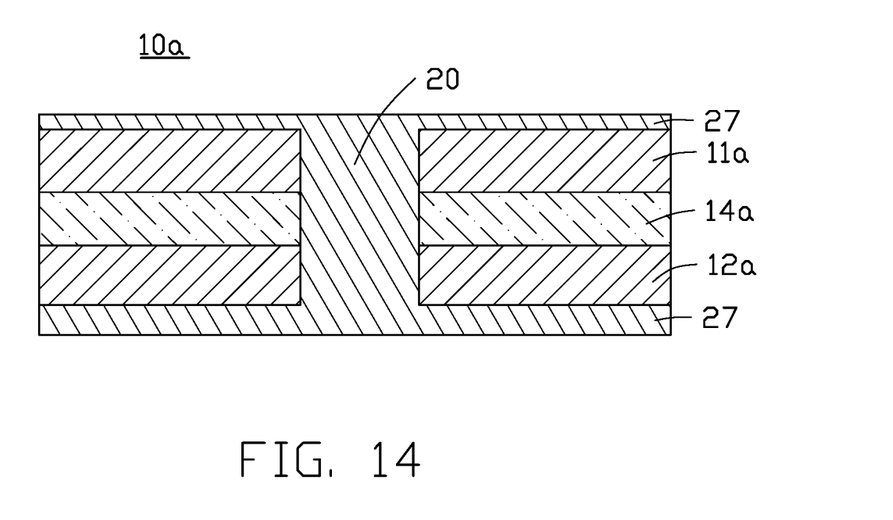
FIG. 14 is a cross-sectional view showing a copper block formed in the first opening of FIG. 1 and two second copper plated layers connected to the copper block.

In step S12, referring to FIG. 14, a copper block 20 is formed in the first opening 16a. The copper block 20 completely infills the first opening 16a. When forming the copper block 20, two second copper plated layers 27 are formed on surfaces of the first copper layer 11a and the second copper layer 12a away from the first substrate layer 14a. The copper block 20 connects the two second copper plated layers 27.

Figure 15:
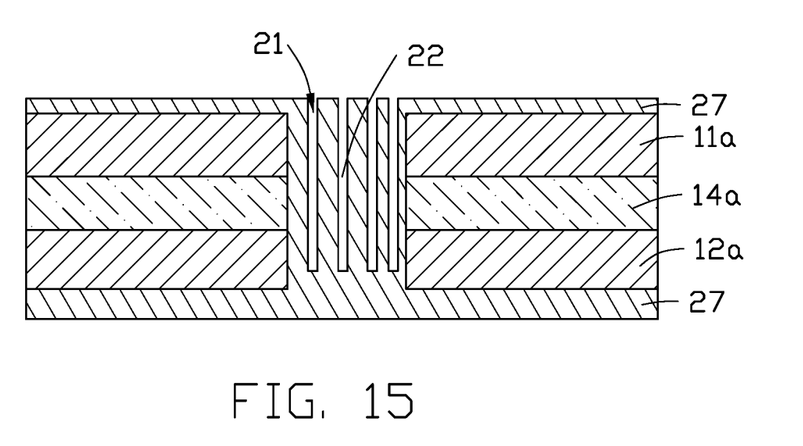
FIG. 15 is a cross-sectional view showing grooves formed on copper block of FIG. 14.

In step S13, referring to FIG. 15, at least one groove 21 is defined on an exposed surface of the copper block 20. The exposed surface of the copper block 20 is recessed inwardly along the first direction to form the groove 21. The exposed surface of the copper block 20 and a surface of the first copper layer 11a away from the first substrate layer 14a are located on a same side of the stacked structure 10a.

In one embodiment, the copper block 20 defines a plurality of grooves 21, and the grooves 21 penetrate the second copper plated layer 27.

Figure 16:
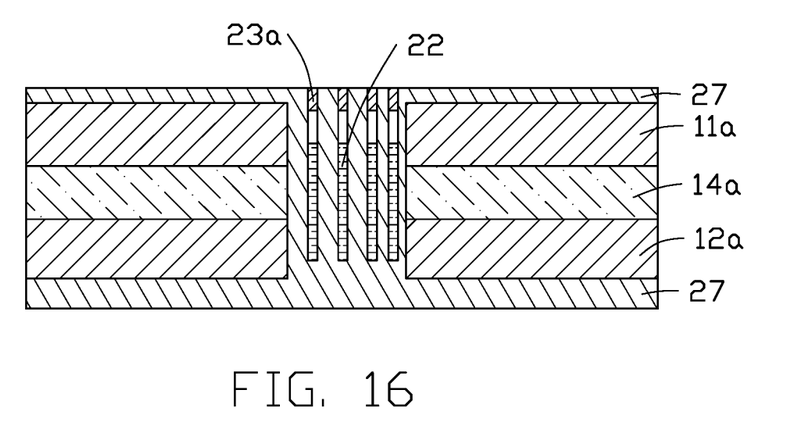
FIG. 16 is a cross-sectional view showing a phase changing liquid contained in the grooves of FIG. 15 and a thermally conductive adhesive sealing the grooves.

In step S14, referring to FIG. 16, a phase changing liquid 22 is injected into the grooves 21. In the first direction, a height of the phase changing liquid 22 received in each of the grooves 21 is less than a height of each of the grooves 21. Each of the grooves 21 is sealed by a thermally conductive adhesive 23a to form a heat dissipation chamber 24, so that the phase changing liquid 22 is sealed in the grooves 21.

In one embodiment, the thermally conductive adhesive 23a are completely received in the grooves 21 in the second copper plated layer 27. When the effective height of the heat dissipation chamber 24 is increased, more phase changing liquid 22 can be received in the heat dissipation structure 30.

Figure 17:
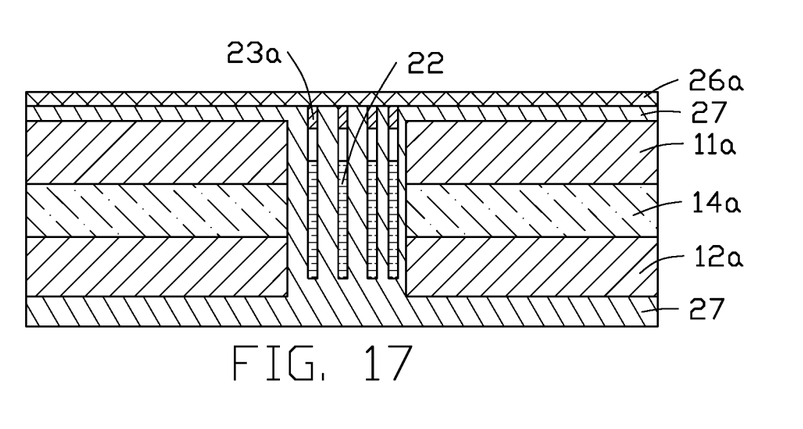
FIG. 17 is a cross-sectional view showing first copper plated layers formed on the second copper plated layers shown in FIG. 16.

In step S15, referring to FIG. 17, a first copper plated layer 26a is formed, the first copper plated layer 26a covering the second copper plated layer 27 and the thermally conductive adhesive 23a.

In the embodiment, two first copper plated layers 26a are formed on opposite surfaces of the stacked structure 10a, and one of the first copper plated layers 26a covers the thermally conductive adhesive 23a.

Figure 18:
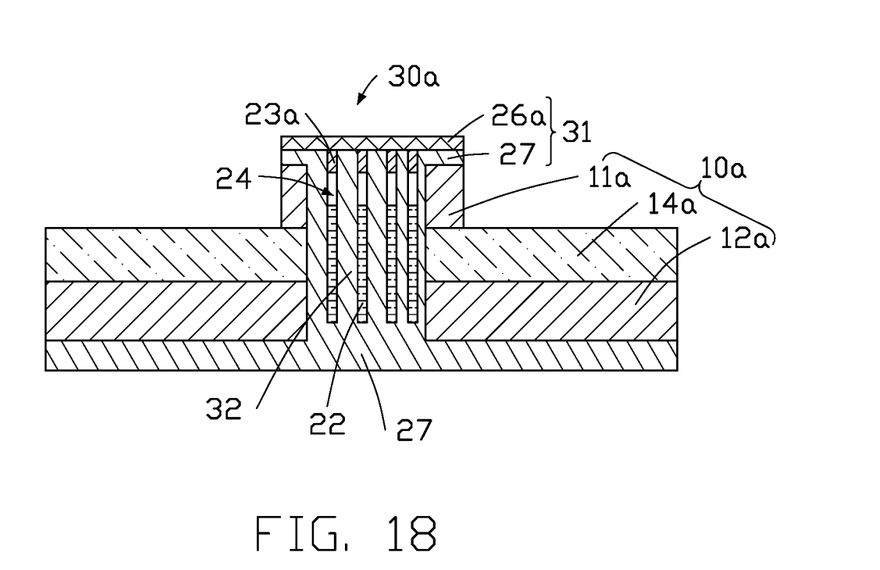
FIG. 18 is a cross-sectional view showing portions of the first copper plated layer, second copper plated layer, and the first copper layer shown in FIG. 17 removed.

In step S16, referring to FIG. 18, portions of the second copper plated layer 27, the first copper plated layer 26a, and the first copper layer 11a which do not correspond in position to the first opening 16a are removed, thereby obtaining the circuit board 100a with the heat dissipation structure 30a.

Figure 19:
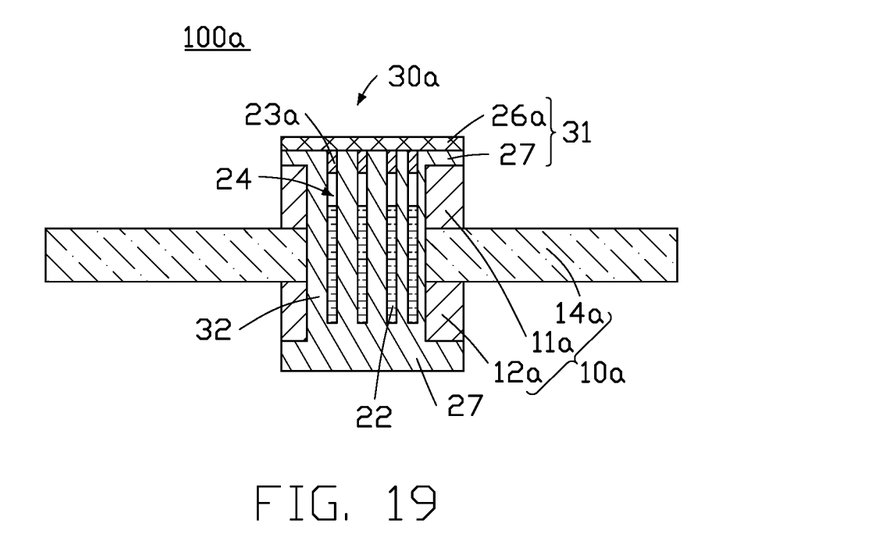
FIG. 19 is a cross-sectional view showing portions of the second copper plated layers and the second copper layer shown in FIG. 18 removed.

Referring to FIG. 19, the method further includes removing portions of the second copper plated layer 27, the first copper plated layer 26a, and the first copper layer 11a which are located on the other surface of the stacked structure 10a and do not correspond in position to the first opening 16a.

FIG. 12 illustrates an embodiment of a circuit board 100. The circuit board 100 includes a stacked structure 10 and a heat dissipation structure 30 partially embedded in the stacked structure 10.

The stacked structure 10 includes a first copper layer 11, a first substrate layer 14, and a second copper layer 12 which are stacked along a first direction. The heat dissipation structure 30 penetrates the first copper layer 11 and the first substrate layer 14 and is connected to the second copper layer 12. In one embodiment, the heat dissipation structure 30 may further penetrate a portion of the second copper layer 12.

In one embodiment, the stacked structure 10 further includes a second substrate layer 15 and a third copper layer 13. The first copper layer 11, the first substrate layer 14, the second copper layer 12, the second substrate layer 15, and the third copper layer 13 are stacked in that order along the first direction. There are two heat dissipation structures 30. One heat dissipation structure 30 penetrates the first copper layer 11 and the first substrate layer 14 and is connected to the second copper layer 12. Another heat dissipation structure 30 penetrates the third copper layer 13 and the second substrate layer 15 and is connected to the second copper layer 12.

In one embodiment, the stacked structure 10 further includes other copper layers or circuit layers located between the first copper layer 11a and the second copper layer 12a, the different copper layers or circuit layers being separated by substrate layers.

The heat dissipation structure 30 includes a base body 31, a covering plate 32, a thermally conductive adhesive 23, and a phase changing liquid 22. The base body 31 defines at least one groove 21, the phase changing liquid 22 is received in the groove 21, the thermally conductive adhesive 23 seals an end of the groove 21. The cover plate 32 is located on a same side of the base body 31 and the thermally conductive adhesive 23 and covers the groove 21. The base body 31 is the copper block 20 which fills in the first opening 16 or fills in the second opening 17.

Each groove 21 is sealed by the thermally conductive adhesive 23 to form a heat dissipation chamber 24. In the first direction, a height of the phase changing liquid 22 received in each groove 21 is less than a height of the heat dissipation chamber 24, so that there is a certain amount of space existing in the heat dissipation chamber 24 for the phase changing liquid 22 to undergo a phase change.

The cover plate 32 includes the first copper plated layer 26 which is located on a surface of the first copper layer 11 or the third copper layer 13 away from the first substrate layer 14 and covers the thermally conductive adhesive 23. In one embodiment, in a second direction perpendicular to the first direction, a surface of the thermally conductive adhesive 23 away from the first substrate layer 14 is flush with a surface of the first copper layer 11 or the third copper layer 13 away from the first substrate layer 14.

In one embodiment, the cover plate 32 further includes the second copper plated layer 27 which is located between the first copper plated layer 26 and the first copper layer 11. In a second direction perpendicular to the first direction, a surface of the thermally conductive adhesive 23 away from the first substrate layer 14 is flush with a surface of the second copper layer 27 away from the first substrate layer 14, and the thermally conductive adhesive 23 is embedded into the second copper plated layer 27.

FIGS. 18 and 19 illustrate another embodiment of a circuit board 100a with a heat dissipation structure 30a. The stacked structure 10a includes a first copper layer 11a, a first substrate layer 14a, and a second copper layer 12a stacked in that order along the first direction. The heat dissipation structure 30a penetrates the first copper layer 11a, the first substrate layer 14a, and the second copper layer 12a. The cover plate 32 of the heat dissipation structure 30a is connected to the first copper plated layer 26a or the second copper plated layer 27.

In the circuit board 100, the heat dissipation structure 30 is embedded into the circuit board 100 and comprises a heat dissipation chamber 24 therein, the phase changing liquid 22 received in the heat dissipation chamber 24 vaporizing as it absorbs heat from the stacked structure 10.

While the present disclosure has been described with reference to particular embodiments, the description is illustrative of the disclosure and is not to be construed as limiting the disclosure. Therefore, those of ordinary skill in the art can make various modifications to the embodiments without departing from the scope of the disclosure as defined by the appended claims.

What is claimed is:

1. A circuit board with a heat dissipation structure comprising:
    a stacked structure comprising a first copper layer, a first substrate layer, and a second copper layer stacked in a first direction; and
    at least one heat dissipation structure comprising:
        a base body comprising at least one groove the base body penetrating the first copper layer and being connected to the second copper layer;
        a phase changing liquid received in the at least one groove;
        a thermally conductive adhesive received in an end of the at least one groove and sealing the at least one groove; and
        a cover plate located on a surface of the base body and covering the thermally conductive adhesive.

2. The circuit board of claim 1, wherein the thermally conductive adhesive seals an end of each of the at least one groove to form a heat dissipation chamber, the phase changing liquid is received in the heat dissipation chamber; in the first direction, a height of the phase changing liquid in the heat dissipation chamber is less than a height of the heat dissipation chamber.

3. The circuit board of claim 1, wherein the at least one heat dissipation structure further penetrates a portion of the second copper layer.

4. The circuit board of claim 1, wherein the stacked structure further comprises a second substrate layer and a third copper layer, the second substrate layer is located on a surface of the second copper layer away from the first substrate layer; a quantity of the at least one heat dissipation structure is more than one, at least one of the heat dissipation structures penetrates the third copper layer and the second substrate layer.

5. The circuit board of claim 1, wherein the at least one heat dissipation structure penetrates the first copper layer, the first substrate layer, and the second copper layer.

6. The circuit board of claim 1, wherein the cover plate comprises a first copper plated layer which is located on a surface of the first copper layer away from the first substrate layer and covers the thermally conductive adhesive, a surface of the thermally conductive adhesive away from the first substrate layer is flush with a surface of the first copper layer away from the first substrate layer in a second direction perpendicular to the first direction.

7. A circuit board of claim 1, wherein the cover plate comprises a first copper plated layer and a second copper plated layer which is located on a surface of the first copper layer facing away from the first substrate layer, the first copper plated layer is located on a surface of the second copper plated layer facing away from the first copper layer and covers the thermally conductive adhesive, a surface of the thermally conductive adhesive away from the first substrate layer is flush with a surface of the first copper plated layer away from the first substrate layer in a second direction perpendicular to the first direction.

8. A method for manufacturing a circuit board with a heat dissipation structure comprising:
    providing a stacked structure comprising a first copper layer, a first substrate layer, and a second copper layer stacked along a first direction and defining a first opening, the first opening penetrating the first copper layer and the first substrate layer along the first direction;
    forming a copper block in the first opening;
    forming at least one groove on a surface of the copper block which is exposed from the first opening;
    injecting a phase changing liquid into the at least one groove;
    applying a thermally conductive adhesive on an end of each of the at least one groove;
    forming a first copper plated layer covering the thermally conductive adhesive and the first copper layer; and
    removing portions of the first copper plated layer and the first copper layer which do not correspond in position to the first opening.

9. The method of claim 8, further comprising forming a second copper plated layer when forming the copper block, the second copper plated layer covering the first copper layer and being connected to the copper block, wherein the first copper plated layer is formed on a surface of the second copper plated layer away from the first copper layer.

10. The method of claim 8, wherein the stacked structure further comprises a second substrate layer and a third substrate layer, the second substrate layer is stacked on a surface of the second copper layer facing away from the first substrate layer, the third copper layer is located on a surface of the second substrate layer facing away from the second copper layer; the stacked structure further comprises a second opening penetrating the third copper layer and the second substrate layer, the method further comprises forming the other copper block in the second opening.

11. The method of claim 8, wherein the first opening further penetrates the second copper layer, and the first copper plated layer is connected to the second copper layer by the first opening.

12. The method of claim 8, wherein in the first direction, a height of each of the at least one groove is less than a sum of a thickness of the copper block and a thickness of the second copper layer.

* * * * *